United States Patent
Liu

(10) Patent No.: US 12,262,604 B2
(45) Date of Patent: Mar. 25, 2025

(54) DISPLAY PANEL AND DISPLAY DEVICE THAT INCLUDE AN ANNULAR REPAIR CIRCUIT

(71) Applicant: SHENZHEN CHINA STAR OPTOELECTRONICS SEMICONDUCTOR DISPLAY TECHNOLOGY CO., LTD., Shenzhen (CN)

(72) Inventor: Chaofan Liu, Shenzhen (CN)

( * ) Notice: Subject to any disclaimer, the term of this patent is extended or adjusted under 35 U.S.C. 154(b) by 0 days.

(21) Appl. No.: 17/599,580

(22) PCT Filed: Jul. 29, 2021

(86) PCT No.: PCT/CN2021/109114
§ 371 (c)(1),
(2) Date: Sep. 29, 2021

(87) PCT Pub. No.: WO2023/279456
PCT Pub. Date: Jan. 12, 2023

(65) Prior Publication Data
US 2024/0032353 A1   Jan. 25, 2024

(30) Foreign Application Priority Data
Jul. 9, 2021 (CN) .......................... 202110777827.3

(51) Int. Cl.
*H10K 59/131* (2023.01)
*H10K 59/88* (2023.01)

(52) U.S. Cl.
CPC .......... *H10K 59/131* (2023.02); *H10K 59/88* (2023.02)

(58) Field of Classification Search
CPC .............................. H10K 59/131; H10K 59/88
See application file for complete search history.

(56) References Cited

U.S. PATENT DOCUMENTS

| | | | | |
|---|---|---|---|---|
| 2011/0216023 A1* | 9/2011 | Kurokawa | ............ | G06F 3/0412 345/173 |
| 2016/0093261 A1* | 3/2016 | Kawamura | .......... | G09G 3/3648 345/204 |
| 2016/0204181 A1* | 7/2016 | So | ....................... | H10K 59/1213 438/4 |

FOREIGN PATENT DOCUMENTS

| | | | | |
|---|---|---|---|---|
| CN | 1787217 A | | 6/2006 | |
| CN | 1916701 A | * | 2/2007 | ............ G02F 1/133 |
| CN | 103278987 A | | 9/2013 | |
| CN | 105655358 A | | 6/2016 | |
| CN | 105760035 A | | 7/2016 | |
| CN | 106201143 A | | 12/2016 | |
| CN | 208444840 U | | 1/2019 | |
| CN | 111258136 A | | 6/2020 | |

(Continued)

OTHER PUBLICATIONS

English translation CN 112562507 (Year: 2021).*
English translation CN 19167601 (Year: 2007).*

*Primary Examiner* — Shaun M Campbell
*Assistant Examiner* — David Paul Sedorook

(57) ABSTRACT

The present disclosure discloses a display panel and a display device. According to the display panel, a fracture is provided on each gate signal line, so that the each gate signal line does not transversely extend through a display area. In this way, an abnormal invalid gate circuit area in a range of the display area at a left part below a dashed line formed by connecting the plurality of the fractures does not affect transmission of a gate signal, thereby reducing a reject ratio of products.

16 Claims, 4 Drawing Sheets

(56) References Cited

FOREIGN PATENT DOCUMENTS

| CN | 112117286 | A | | 12/2020 | | |
|----|-----------|---|---|---------|---|---|
| CN | 112130389 | A | | 12/2020 | | |
| CN | 112562507 | A | * | 3/2021 | ............. | G01N 21/95 |

* cited by examiner

DISPLAY PANEL AND DISPLAY DEVICE THAT INCLUDE AN ANNULAR REPAIR CIRCUIT

FIELD OF INVENTION

The present disclosure relates to the field of display technologies, and in particular, to a display panel and a display device including the display panel.

BACKGROUND OF INVENTION

An organic light-emitting diode (OLED) display technology has a characteristic of self-illumination, and adopts a very thin coating of organic materials and a glass base plate. When there is current conveyance, these organic materials illuminate. In addition, an OLED display screen has a large visual angle, can significantly save electric energy, and is widely applicable to screens of mobile phones. Medium-size and large size screens are being developed toward a mass production phase. Realizing a flexible foldable property is a key direction of future development.

FIG. 1 shows a schematic diagram of a design of a current medium-size flexible OLED product. In order to realize a foldable property, a wiring direction of a gate circuit 211 is as follows. A gate chip on film (gate COF) 210 is disposed on a right side of a back panel 200. A transmission manner for the gate circuit 211 in a display area is designed as a drainage. That is to say, after being inputted to the display area by using the gate COF 210, a gate signal is transmitted to a vertical scan line 221 through a via hole 212, so as to control a thin film transistor (TFT) switch. A horizontal signal means a penetrating signal (that is, after being transmitted leftward from a right side in FIG. 1 and then in an up/down direction through the via hole 212, the gate signal is further transmitted transversely leftward). FIG. 2 shows a film layer structure at the via hole 212. The horizontal gate signal is transmitted to an M2 layer 220 in an up/down direction through the via hole 212 (a direction shown by an arrow in FIG. 1 is a transmission direction of the current gate signal). A dashed line in FIG. 1 is a line connecting via holes 212 between one gate circuit 211 and one scan circuit 221.

A disadvantage of such a design is that, a gate signal in a part of the display area in FIG. 1 can be invalid, that is, an area range (within half an area of the display area of the entire display panel) of a display area at a left part below a dashed line in FIG. 1 is actually an invalid gate signal range but still has gate signal transmission. As a result, a probability of abnormality of a gate circuit as a result of particles or film residues is increased by 50%.

SUMMARY OF INVENTION

Technical Problem

Embodiments of the present disclosure provide a display panel and a display device including the display panel, to resolve a display panel and a display device including the display panel.

Technical Solution

Embodiments of the present disclosure provide a display panel. The display panel includes a non-display area and a display area located inside the non-display area. A gate signal source connected to the non-display area and configured to generate a gate signal is disposed outside one end of the non-display area. The display area includes a substrate base plate, a gate signal layer, a non-metal layer, and a metal layer, wherein the metal layer and the gate signal layer are in a spaced arrangement. The gate signal layer includes more than two gate signal lines in a parallel and spaced arrangement. One ends of the gate signal lines are connected to the gate signal source, and other ends of the gate signal lines extend away from the end of the gate signal source. The metal layer includes more than two scan lines in a parallel and spaced arrangement. One scan line corresponds to one gate signal line. The scan line is electrically connected to the corresponding gate signal line through a first via hole. A fracture is provided on each of the gate signal lines, to divide the each gate signal line into a first signal line segment and a second signal line segment in a spaced arrangement. The first signal line segment is connected to the gate signal source and electrically connected to the corresponding scan line through the first via hole.

Further, an annular anti-static electrode line is disposed on an edge inside the display area in a circumferential direction of the display area. One end of the second signal line segment that is away from the first signal line segment is connected to the anti-static electrode line.

Further, an orthographic projection of the gate signal line that is on a face of the non-metal layer that faces away from the gate signal layer is perpendicular to an orthographic projection of the scan line that is on the face of the non-metal layer that faces away from the gate signal layer.

Further, the display area further includes an annular repair circuit located inside the anti-static electrode line and disposed on a face of the non-metal layer that faces away from the gate signal layer. The first signal line segment and the second signal line segment intersect with an orthographic projection of the repair circuit that is on the gate signal layer, and are electrically connected to the repair circuit. The scan line is electrically connected to the second signal line segment.

Further, when the first signal line segment is abnormal, a second via hole extending through the non-metal layer is formed on a surface of the repair circuit that corresponds to an intersection with each first signal line segment. The first signal line segment is electrically connected to the repair circuit through the second via hole, so that the gate signal in the first signal line segment is transmitted to the repair circuit. A third via hole extending through the non-metal layer is formed on a surface of the repair circuit that corresponds to an intersection with each second signal line segment. The second signal line segment is electrically connected to the repair circuit through the third via hole, so that the gate signal in the repair circuit is transmitted to the second signal line segment. The scan line is electrically connected to the second signal line segment through a fourth via hole, so that the gate signal in the second signal line segment is transmitted to the scan line.

Further, the non-metal layer includes a buffer layer disposed on a face of the gate signal layer that faces away from the substrate base plate, an interlayer dielectric layer disposed on a face of the buffer layer that faces away from the gate signal layer, a passivation protection layer disposed on a face of the interlayer dielectric layer that faces away from the buffer layer, and a planarization layer disposed on a face of the passivation protection layer that faces away from the interlayer dielectric layer. The metal layer is disposed on the face of the interlayer dielectric layer that faces away from the buffer layer, and the first via hole extends through the interlayer dielectric layer and the buffer layer. The fourth via hole extends through the interlayer dielectric layer and the buffer layer.

Further, at least one isolation opening used for isolating the repair circuit is provided on the repair circuit between the second via hole and the third via hole, so that the gate signal transmitted to the repair circuit is transmitted to the second signal line segment in a clockwise direction.

Further, at least one isolation opening used for isolating the repair circuit is provided on the repair circuit between the second via hole and the third via hole, so that the gate signal transmitted to the repair circuit is transmitted to the second signal line segment in a counterclockwise direction.

In order to realize the above purposes, the present invention further provides a display device. The display device includes the above display panel.

Beneficial Effects

The present disclosure has the following beneficial effects. A fracture is provided on each gate signal line, so that the each gate signal line does not transversely extend through the display area. In this way, an abnormal invalid gate circuit area in a range of the display area at a left part below a dashed line (within half the display area of the entire display panel) does not affect transmission of a gate signal, thereby reducing the reject ratio of products. In addition, when first signal line segment is abnormal, the first signal line segment is connected to the second signal line segment using the repair circuit, so that normal transmission of the gate signal is realized using the repair circuit and the second signal line segment (which are originally invalid circuits) when the first signal line segment is abnormal thereby avoiding a yield loss.

BRIEF DESCRIPTION OF DRAWINGS

The following describes specific implementations of the present disclosure in detail with reference to the accompanying drawings, to make the technical solutions and other beneficial effects of the present disclosure obvious.

Figure 1:
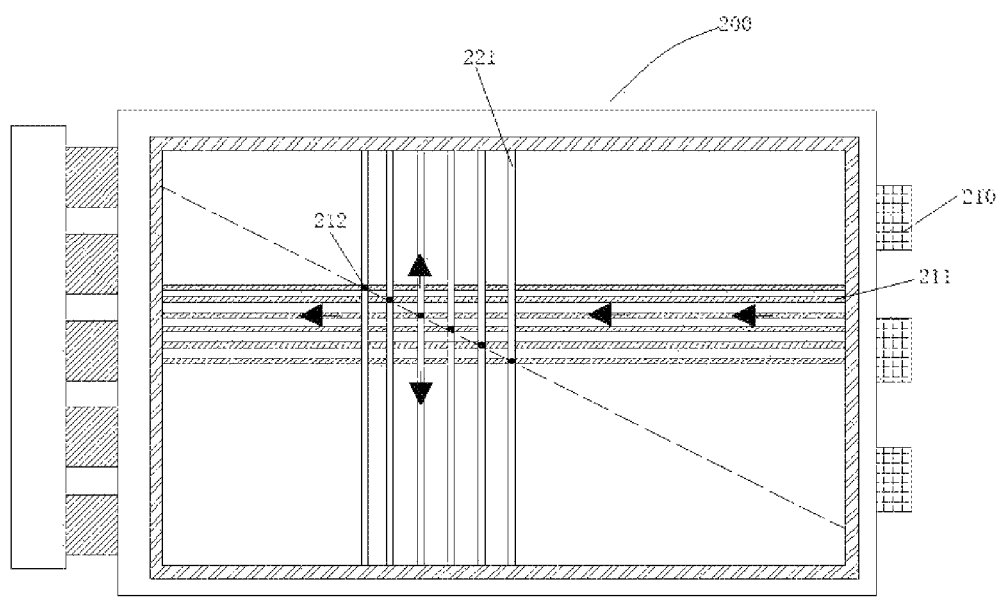
FIG. 1 is a schematic diagram of a wiring structure of a gate circuit and a scan circuit of a conventional back panel.
Figure 2:
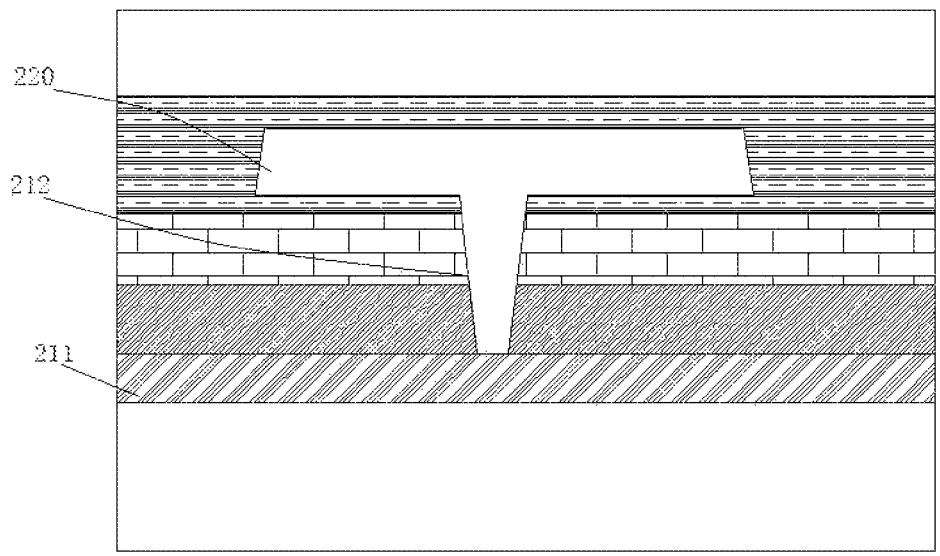
FIG. 2 is a schematic diagram of a film layer structure at a via hole of a gate circuit and a scan circuit in a conventional back panel.
Figure 3:
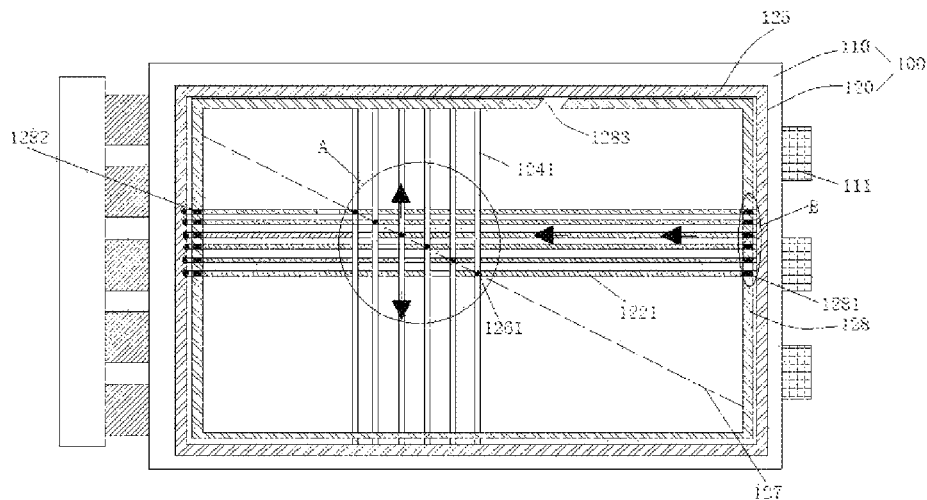
FIG. 3 is a schematic diagram of a wiring structure of a gate signal line and a scan line in a display panel according to an exemplary embodiment of the present invention.
Figure 3A:
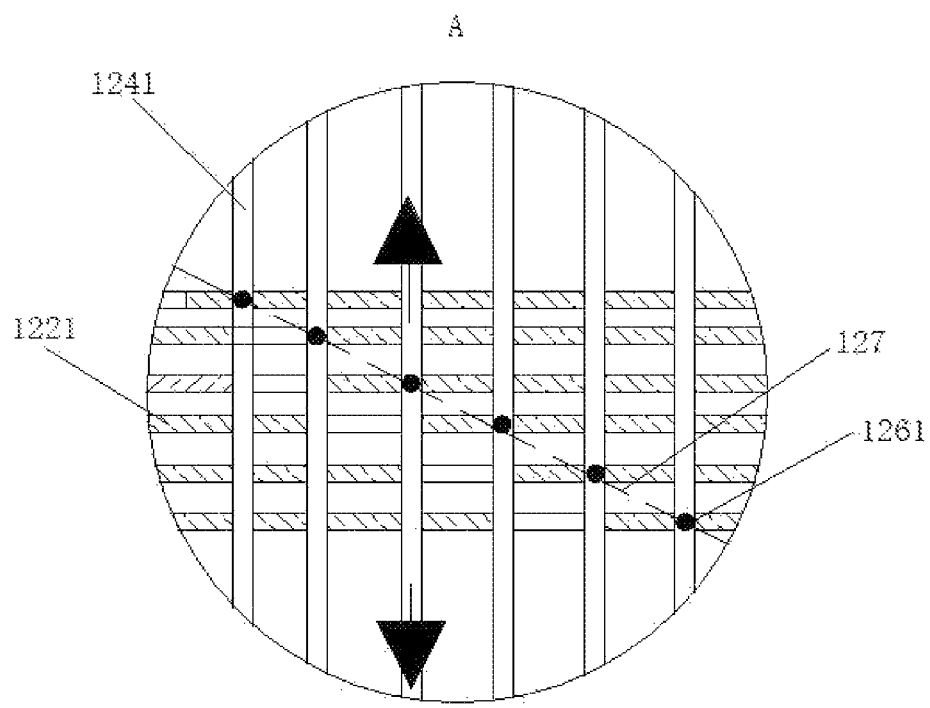
FIG. 3a is a schematic enlarged view of a structure at A in FIG. 3.
Figure 4:
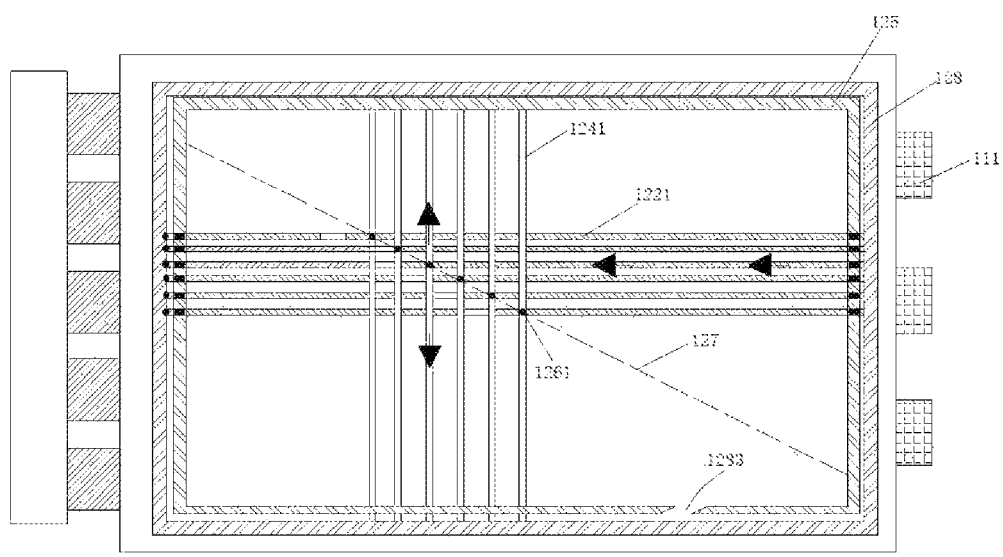
FIG. 4 is a schematic diagram of a wiring structure of a gate signal line and a scan line in a display panel according to an exemplary embodiment of the present invention.

Directions of arrows shown in FIG. 1, FIG. 3, and FIG. 4 are transmission directions of a gate signal.

REFERENCE NUMERALS

100. Display panel; 110. Non-display area; 111. Gate signal source; 120. Display area; 121. Substrate base plate; 122. Gate signal layer; 1221. Gate signal line; 1221a. First signal line segment; 1221b. Second signal line segment; 1222. Fracture; 123. Non-metal layer; 1231. buffer layer; 1232. Interlayer dielectric layer; 1233. Passivation protection layer; 1234. Planarization layer; 125. Anti-static electrode line; 1261. First via hole; 1262. Fourth via hole; 127. Dotted line; 128. Repair circuit; 1281. Second via hole; 1282. Third via hole; 1283. Isolation opening;

200. Back panel; 210. Gate chip on film; 211. Gate circuit; 212. Via hole; 220. M2 layer; 221. Scan circuit.

DETAILED DESCRIPTION OF PREFERRED EMBODIMENTS

The technical solutions of the embodiments of the present invention are clearly and completely described in the following with reference to the accompanying drawings of the embodiments of the present invention. Apparently, the described embodiments are merely some but not all of the embodiments of the present invention. All other embodiments obtained by a person skilled in the art based on the embodiments of the present invention without creative efforts shall fall within the protection scope of the present invention.

In a display panel, a fracture is provided on each gate signal line, so that the each gate signal line does not transversely extend through the display area. In this way, an abnormal invalid circuit area in a range of the display area at a left part below a dashed line (within half the display area of the entire display panel) does not affect transmission of a gate signal, thereby reducing the reject ratio of products. In addition, the repair circuit is connected to the first signal line segment and the second signal line segment, so that normal transmission of a gate signal is realized using the repair circuit and the second signal line segment (which are originally invalid circuits) when the first signal line segment is abnormal thereby avoiding a yield loss. As a typical application, the display panel is applicable to a display device, such as an OLED display.

In an embodiment of the present invention, referring to FIG. 3, FIG. 3a, FIG. 5, and FIG. 6, a display panel 100 includes a non-display area 110, a display area 120 located inside the non-display area 110, and a gate signal source 111 (a gate chip on film (gate COF)) connected to the non-display area 110 and configured to generate a gate signal. The display area 120 includes a substrate base plate 121, a gate signal layer 122, a non-metal layer 123, and a metal layer 124. An annular anti-static electrode line 125 (an ESD com-line) is disposed on an edge inside the display area 120 in a circumferential direction of the display area 120.

Figure 5:
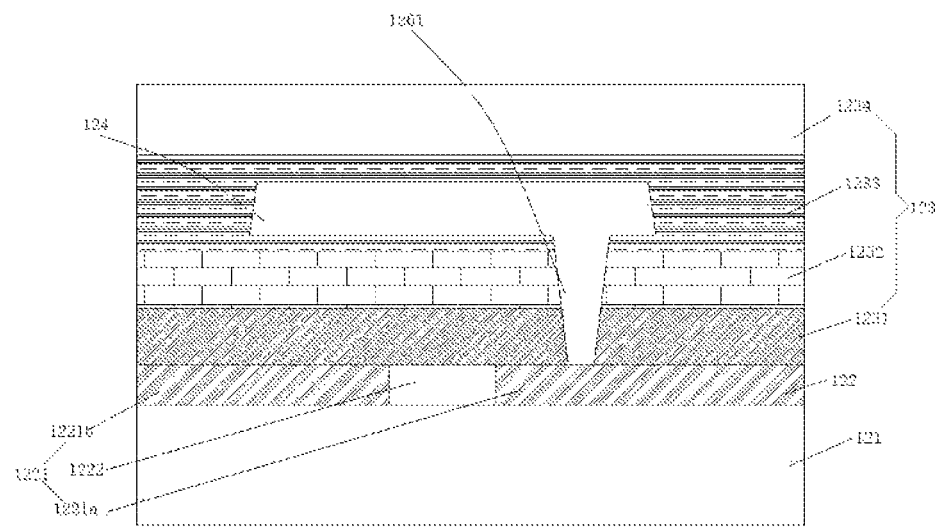
FIG. 5 is a schematic diagram of a film layer structure at a first via hole of a first signal line segment and a scan line in a display panel according to an exemplary embodiment of the present invention.

Referring to FIG. 5, the non-metal layer 123 includes a buffer layer 1231 disposed on a face of the gate signal layer 122 that faces away from the substrate base plate 121, an interlayer dielectric layer 1232 disposed on a face of the buffer layer 1231 that faces away from the gate signal layer 122, a passivation protection layer 1233 disposed on a face of the interlayer dielectric layer 1232 that faces away from the buffer layer 1231, and a planarization layer 1234 disposed on a face of the passivation protection layer 1233 that faces away from the interlayer dielectric layer 1232. The metal layer 124 is disposed on a face of the interlayer dielectric layer 1232 that faces away from the buffer layer 1231.

The gate signal layer 122 includes more than two gate signal lines 1221 in a parallel and spaced arrangement. One ends of the gate signal lines 1221 are connected to the gate signal source 111 and are configured to transmit a gate signal generated by the gate signal source 111. Other ends of the gate signal lines 1221 extend away from the end of the gate signal source 111.

The metal layer 124 includes more than two scan lines 1241 in a parallel and spaced arrangement. One scan line 1241 corresponds to one gate signal line 1221. The scan line 1241 is electrically connected to the corresponding gate signal line 1221 through a first via hole 1261 provided in the non-metal layer 123. Referring to FIG. 3, an orthographic projection of the gate signal line 1221 that is on a face of the non-metal layer 123 that faces away from the gate signal layer 122 (that is, a face of the planarization layer 1234 that faces away from the passivation protection layer 1233) is perpendicular to an orthographic projection of the scan line 1241 that is on the face of the non-metal layer 123 that faces away from the gate signal layer 122.

Referring to FIG. 5, in the present embodiment, the first via hole 1261 extends through the interlayer dielectric layer 1232 and the buffer layer 1231, and the gate signal layer 122 is exposed from the first via hole 1261. In the present embodiment, a fracture 1222 is provided on each of the gate signal lines 1221, to divide the each gate signal line 1221 into a first signal line segment 1221*a* and a second signal line segment 1221*b* in a spaced arrangement. The first signal line segment 1221*a* is connected to the gate signal source 111 and electrically connected to the corresponding scan line 1241 through the first via hole 1261.

Since there are a plurality of gate signal lines 1221 and scan lines 1241 in a one-to-one correspondence, the first via hole 1261 also includes a plurality of via holes. A dashed line can be obtained by successively connecting orthographic projections of the plurality of the first via holes 1261 that are on the planarization layer 1234, that is, a line 127 shown in FIG. 3. In the present embodiment, a fracture 1222 is provided on the gate signal line 1221, to divide the gate signal line 1221 into a first signal line segment 1221*a* and a second signal line segment 1221*b*, so that signal on the gate signal line 1221 does not extend through the display area 120. The gate signal enters the display area 120 through the first signal line segment 1221*a* and is transmitted to the corresponding scan line 1241 in the metal layer 124 through the first via hole 1261, but does not enter the second signal line segment 1221*b* (that is, is not further transmitted along the gate signal line 1221). Thus, if an area (having an area equivalent to ½ of an area of the whole display area 120) of the display area 120 on a left side of the dashed line 127 in FIG. 3 has an abnormal invalid circuit. However, since the gate signal is not transmitted to the area, the transmission of the gate signal in the display panel 100 is not affected, reducing a reject ratio of products.

In another embodiment of the present invention, referring to FIG. 3, one end of the second signal line segment 1221*b* that is away from the first signal line segment 1221*a* is connected to the anti-static electrode line 125. Therefore, floating of a potential as result of disconnection between the second signal line segment 1221*b* and the first signal line segment 1221*a* can be avoided.

In another embodiment of the present invention, referring to FIG. 3, the display area 120 further includes an annular repair circuit 128. The repair circuit 128 is located inside the anti-static electrode line 125 and disposed on a face of the non-metal layer 123 that faces away from the gate signal layer 122. In detail, the repair circuit 128 is disposed on the face of the planarization layer 1234 that faces away from the passivation protection layer 1233. The first signal line segment 1221*a* and the second signal line segment 1221*b* intersect with an orthographic projection of the repair circuit 128 that is on the gate signal layer 122, and are electrically connected to the repair circuit 128. The scan line 1241 is electrically connected to the first signal line segment 1221*a*. The repair circuit 128 is made of a same material as the metal layer 124, which is Mo/Al/Mo alloy.

Figure 3B:
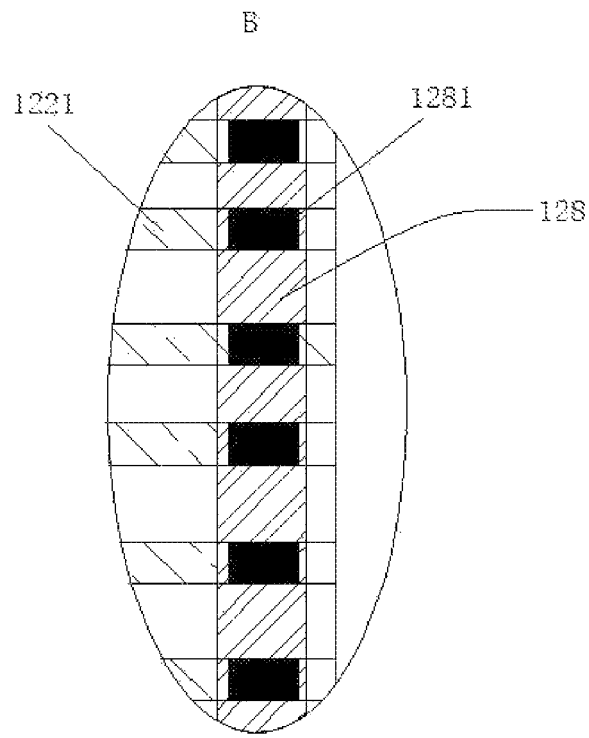
FIG. 3b is a schematic enlarged view of a structure at B in FIG. 3.
Figure 6:
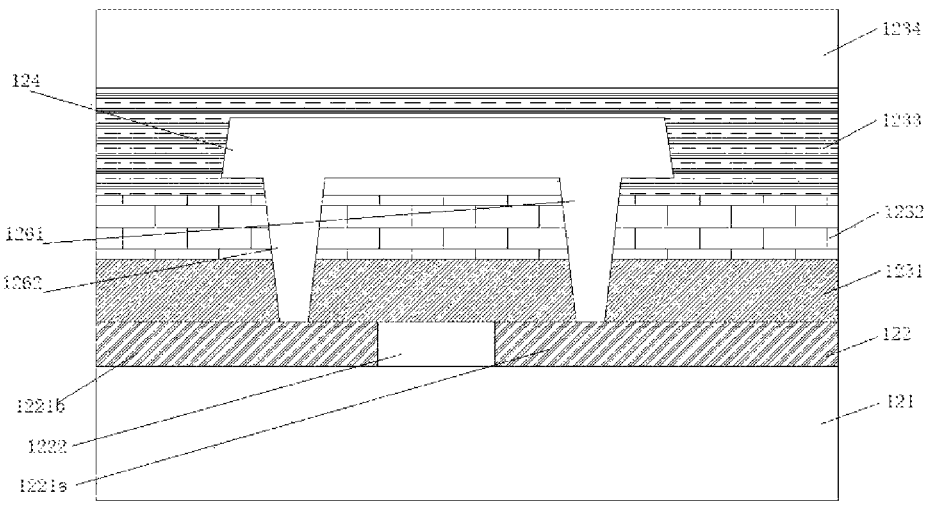
FIG. 6 is a schematic diagram of a film layer structure at a first via hole of a gate signal line and a scan line in a display panel according to another exemplary embodiment of the present invention.

In the present embodiment, referring to FIG. 3 and FIG. 3*b*, when the first signal line segment 1221*a* is abnormal, a second via hole 1281 extending through the non-metal layer 123 is formed on a surface of the repair circuit 128 that corresponds to an intersection with each first signal line segment 1221*a*, and the first signal line segment 1221*a* is electrically connected to the repair circuit 128 through the second via hole 1281, so that the gate signal in the first signal line segment 1221*a* is transmitted to the repair circuit 128. A third via hole 1282 extending through the non-metal layer 123 is formed on a surface of the repair circuit 128 that corresponds to an intersection with each second signal line segment 1221*b*, and the second signal line segment 1221*b* is electrically connected to the repair circuit 128 through the third via hole 1282, so that the gate signal in the repair circuit 128 is transmitted to the second signal line segment 1221*b*. Referring to FIG. 6, when the first signal line segment 1221*a* is abnormal, the scan line 1241 is electrically connected to the second signal line segment 1221*b* through a fourth via hole 1262, so that the gate signal in the second signal line segment 1221*b* is transmitted to the scan line 1241.

In the present embodiment, when the first signal line segment 1221*a* is normal, the gate signal in the first signal line segment 1221*a* is transmitted to the scan line 1241 through the first signal line segment 1221*a*. When the first signal line segment 1221*a* is abnormal and unable to transmit the gate signal, a circle of repair circuit 128 is added. The gate signal outputted by the gate signal source 111 is transmitted to the corresponding scan line 1241 by using the repair circuit 128 and the second signal line segment 1221*b*, without using the first signal line segment 1221*a*. By means of the design of the fourth via hole 1262, the second signal line segment 1221*b* is connected to the scan line 1241, and the gate signal transmitted to the second signal line segment 1221*b* is transmitted to the scan line 1241 to switch on a TFT switch. Therefore, when the first signal line segment 1221*a* is abnormal, the gate signal can be transmitted to the second signal line segment 1221*b* by using the repair circuit 128. Although the second signal line segment 1221*b* is originally an invalid circuit because of the design of the fracture 1222, a valid circuit is formed by virtue of the design of the repair circuit 128 and the fourth via hole 1262 to normally transmit the gate signal, so that a yield loss is avoided, thereby improving the yield of products (that is, of the display panel 100, or even of the display device), The first via hole 1261 connecting the metal layer 124 and the gate signal layer 122 is formed by using a yellow light process. The second via hole 1281, the third via hole 1282, and the fourth via hole 1262 are formed by means of laser dotting using a laser repair machine when the first signal line segment 1221*a* of the gate signal line 1221 is abnormal and unable to transmit the gate signal and requires to be repaired. By means of the laser dotting, the non-metal layer 123 can be penetrated, and the metal layer 124 and the repair circuit 128 can be melted, that is, the melted metal layer 124 flows to the gate signal layer 122 along the second via hole 1262 formed by the interlayer dielectric layer 1232 and the buffer layer 1231 that are penetrated, so as to realize electrical connection. Likewise, the melted repair circuit 128 is electrically connected to the first signal line segment 1221a along the second via hole 1281 formed by penetrating the non-metal layer 123, and electrically connected to the second signal line segment 1221b along the third via hole 1282.

In another embodiment of the present invention, referring to FIG. 3, at least one isolation opening 1283 used for isolating the repair circuit 128 is provided on the repair circuit 128 between the second via hole 1281 and the third via hole 1282, so that the gate signal transmitted to the repair circuit 128 is transmitted to the second signal line segment 1221b in a clockwise direction. In the present embodiment, since there are a plurality of gate signal lines 1221, the second via hole 1281 and the third via hole 1282 each also include a plurality of via holes in a spaced arrangement. Thus, in the present embodiment, the isolation opening 1283 is provided between an outermost one of the plurality of second via holes 1281 and an outermost one of the plurality of third via holes 1282. By means of the arrangement of the isolation opening 1283, a loop of the repair circuit 128 is cut off, so that the gate signal in the repair circuit 128 can be transmitted to the second signal line segment 1221b only in a clockwise direction (unidirectionally) shown in FIG. 3. If the gate signal is simultaneously transmitted in two directions (clockwise and counter-clockwise directions) along the repair circuit 128, floating of the signal is caused.

In another embodiment of the present invention, referring to FIG. 4, at least one isolation opening 1283 used for isolating the repair circuit 128 is provided on the repair circuit 128 between the second via hole 1281 and the third via hole 1282, so that the gate signal transmitted to the repair circuit 128 is transmitted to the second signal line segment 1221b in a counterclockwise direction. In the present embodiment, since the isolation opening 1283 is provided between the outermost one of the plurality of second via holes 1281 and the outermost one of the plurality of third via holes 1282, the gate signal in the repair circuit 128 can be transmitted to the second signal line segment 1221b only in a counterclockwise direction (unidirectionally) shown in FIG. 4.

In conclusion, although exemplary embodiments of the present disclosure have been disclosed above, the exemplary embodiment are not intended to limit the present disclosure. A person of ordinary skill in the art can make various modifications and embellishments without departing from the spirit and scope of the present disclosure. Therefore, the protection scope of the present disclosure falls within the scope defined by the claims.

What is claimed is:

1. A display panel, comprising a non-display area and a display area located inside the non-display area, wherein a gate signal source connected to the non-display area and configured to generate a gate signal is disposed outside one end of the non-display area;

the display area comprises: a substrate base plate, a gate signal layer, a non-metal layer, and a metal layer, wherein the metal layer and the gate signal layer are in a spaced arrangement; and the gate signal layer comprises more than two gate signal lines in a parallel and spaced arrangement, one ends of the gate signal lines are connected to the gate signal source, other ends of the gate signal lines extend away from the end of the gate signal source, the metal layer comprises more than two scan lines in a parallel and spaced arrangement, one scan line corresponds to one gate signal line, and the scan line is electrically connected to the corresponding gate signal line through a first via hole, wherein a fracture is provided on each of the gate signal lines, to divide the each gate signal line into a first signal line segment and a second signal line segment in a spaced arrangement, and the first signal line segment is connected to the gate signal source and electrically connected to the corresponding scan line through the first via hole;

the display area further comprises an annular repair circuit located inside the anti-static electrode line and disposed on a face of the non-metal layer that faces away from the gate signal layer, the first signal line segment and the second signal line segment intersect with an orthographic projection of the repair circuit that is on the gate signal layer, and are electrically connected to the repair circuit, and the scan line is electrically connected to the second signal line segment;

when the first signal line segment is abnormal, a second via hole extending through the non-metal layer is formed on a surface of the repair circuit that corresponds to an intersection with each first signal line segment, and the first signal line segment is electrically connected to the repair circuit through the second via hole, so that the gate signal in the first signal line segment is transmitted to the repair circuit;

a third via hole extending through the non-metal layer is formed on a surface of the repair circuit that corresponds to an intersection with each second signal line segment, and the second signal line segment is electrically connected to the repair circuit through the third via hole, so that the gate signal in the repair circuit is transmitted to the second signal line segment; and the scan line is electrically connected to the second signal line segment through a fourth via hole, so that the gate signal in the second signal line segment is transmitted to the scan line.

2. The display panel as claimed in claim 1, wherein an annular anti-static electrode line is disposed on an edge inside the display area in a circumferential direction of the display area, and one end of the second signal line segment that is away from the first signal line segment is connected to the anti-static electrode line.

3. The display panel as claimed in claim 1, wherein an orthographic projection of the gate signal line that is on a face of the non-metal layer that faces away from the gate signal layer is perpendicular to an orthographic projection of the scan line that is on the face of the non-metal layer that faces away from the gate signal layer.

4. The display panel as claimed in claim 1, wherein the non-metal layer comprises a buffer layer disposed on a face of the gate signal layer that faces away from the substrate base plate, an interlayer dielectric layer disposed on a face of the buffer layer that faces away from the gate signal layer, a passivation protection layer disposed on a face of the interlayer dielectric layer that faces away from the buffer layer, and a planarization layer disposed on a face of the passivation protection layer that faces away from the interlayer dielectric layer;

the metal layer is disposed on the face of the interlayer dielectric layer that faces away from the buffer layer, and the first via hole extends through the interlayer dielectric layer and the buffer layer; and the fourth via hole extends through the interlayer dielectric layer and the buffer layer.

5. The display panel as claimed in claim 1, wherein at least one isolation opening used for isolating the repair circuit is provided on the repair circuit between the second via hole and the third via hole, so that the gate signal transmitted to the repair circuit is transmitted to the second signal line segment in a clockwise direction.

6. The display panel as claimed in claim 5, wherein the isolation opening is provided between an outermost one of the plurality of second via holes and an outermost one of the plurality of third via holes.

7. The display panel as claimed in claim 1, wherein at least one isolation opening used for isolating the repair circuit is provided on the repair circuit between the second via hole and the third via hole, so that the gate signal transmitted to the repair circuit is transmitted to the second signal line segment in a counterclockwise direction.

8. The display panel as claimed in claim 7, wherein the isolation opening is provided between an outermost one of the plurality of second via holes and an outermost one of the plurality of third via holes.

9. A display device, comprising a display panel, wherein the display panel comprises a non-display area and a display area located inside the non-display area, and a gate signal source connected to the non-display area and configured to generate a gate signal is disposed outside one end of the non-display area;
the display area comprises: a substrate base plate, a gate signal layer, a non-metal layer, and a metal layer, wherein the metal layer and the gate signal layer are in a spaced arrangement; and
the gate signal layer comprises more than two gate signal lines in a parallel and spaced arrangement, one ends of the gate signal lines are connected to the gate signal source, other ends of the gate signal lines extend away from the end of the gate signal source, the metal layer comprises more than two scan lines in a parallel and spaced arrangement, one scan line corresponds to one gate signal line, and the scan line is electrically connected to the corresponding gate signal line through a first via hole, wherein
a fracture is provided on each of the gate signal lines, to divide the each gate signal line into a first signal line segment and a second signal line segment in a spaced arrangement, and the first signal line segment is connected to the gate signal source and electrically connected to the corresponding scan line through the first via hole;
the display area further comprises an annular repair circuit located inside the anti-static electrode line and disposed on a face of the non-metal layer that faces away from the gate signal layer, the first signal line segment and the second signal line segment intersect with an orthographic projection of the repair circuit that is on the gate signal layer, and are electrically connected to the repair circuit, and the scan line is electrically connected to the second signal line segment;
when the first signal line segment is abnormal, a second via hole extending through the non-metal layer is formed on a surface of the repair circuit that corresponds to an intersection with each first signal line segment, and the first signal line segment is electrically connected to the repair circuit through the second via hole, so that the gate signal in the first signal line segment is transmitted to the repair circuit;
a third via hole extending through the non-metal layer is formed on a surface of the repair circuit that corresponds to an intersection with each second signal line segment, and the second signal line segment is electrically connected to the repair circuit through the third via hole, so that the gate signal in the repair circuit is transmitted to the second signal line segment; and
the scan line is electrically connected to the second signal line segment through a fourth via hole, so that the gate signal in the second signal line segment is transmitted to the scan line.

10. The display device as claimed in claim 9, wherein an annular anti-static electrode line is disposed on an edge inside the display area in a circumferential direction of the display area, and one end of the second signal line segment that is away from the first signal line segment is connected to the anti-static electrode line.

11. The display device as claimed in claim 9, wherein an orthographic projection of the gate signal line that is on a face of the non-metal layer that faces away from the gate signal layer is perpendicular to an orthographic projection of the scan line that is on the face of the non-metal layer that faces away from the gate signal layer.

12. The display device as claimed in claim 9 wherein the non-metal layer comprises a buffer layer disposed on a face of the gate signal layer that faces away from the substrate base plate, an interlayer dielectric layer disposed on a face of the buffer layer that faces away from the gate signal layer, a passivation protection layer disposed on a face of the interlayer dielectric layer that faces away from the buffer layer, and a planarization layer disposed on a face of the passivation protection layer that faces away from the interlayer dielectric layer; the metal layer is disposed on the face of the interlayer dielectric layer that faces away from the buffer layer, and the first via hole extends through the interlayer dielectric layer and the buffer layer; and the fourth via hole extends through the interlayer dielectric layer and the buffer layer.

13. The display device as claimed in claim 9, wherein at least one isolation opening used for isolating the repair circuit is provided on the repair circuit between the second via hole and the third via hole, so that the gate signal transmitted to the repair circuit is transmitted to the second signal line segment in a clockwise direction.

14. The display panel as claimed in claim 13, wherein the isolation opening is provided between an outermost one of the plurality of second via holes and an outermost one of the plurality of third via holes.

15. The display device as claimed in claim 9, wherein at least one isolation opening used for isolating the repair circuit is provided on the repair circuit between the second via hole and the third via hole, so that the gate signal transmitted to the repair circuit is transmitted to the second signal line segment in a counterclockwise direction.

16. The display panel as claimed in claim 15, wherein the isolation opening is provided between an outermost one of the plurality of second via holes and an outermost one of the plurality of third via holes.

* * * * *